(12) United States Patent
Yamamoto et al.

(10) Patent No.: US 7,294,416 B2
(45) Date of Patent: Nov. 13, 2007

(54) HARD FILM

(75) Inventors: Kenji Yamamoto, Kobe (JP); Seiichiro Ohmoto, Kobe (JP); Mikako Takeda, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 230 days.

(21) Appl. No.: 10/807,332

(22) Filed: Mar. 24, 2004

(65) Prior Publication Data

US 2004/0191153 A1 Sep. 30, 2004

(30) Foreign Application Priority Data

Mar. 25, 2003 (JP) ............................. 2003-082955

(51) Int. Cl.
*B32B 9/00* (2006.01)
(52) U.S. Cl. .................................... 428/698; 106/286.2
(58) Field of Classification Search .............. 106/286.2; 428/698
See application file for complete search history.

(56) References Cited

FOREIGN PATENT DOCUMENTS

| DE | 954 301 | | 11/1956 |
|---|---|---|---|
| DE | 38 03 014 A1 | | 8/1989 |
| DE | 288 625 A5 | | 4/1991 |
| JP | 07-133111 | | 5/1995 |
| JP | 08-118106 | * | 5/1996 |
| JP | 09-011004 | * | 1/1997 |
| JP | 09-019806 | | 1/1997 |
| JP | 11-320214 | | 11/1999 |
| JP | 2001-121314 | * | 5/2001 |
| JP | 2001-179503 | | 7/2001 |
| JP | 2001-232501 | | 8/2001 |
| JP | 2002-18606 | | 1/2002 |
| JP | 2002-254208 | | 9/2002 |
| JP | 2002-266697 | | 9/2002 |
| JP | 2002-337004 | | 11/2002 |

OTHER PUBLICATIONS

Patent Abstracts of Japan, JP 02-189748, Jul. 25, 1990.
Patent Abstracts of Japan, JP 05-195196, Aug. 3, 1993.
Patent Abstracts of Japan, JP 06-158272, Jun. 7, 1994.
U.S. Appl. No. 10/743,735, filed Dec. 24, 2003, Yamamoto et al.
U.S. Appl. No. 10/769,913, filed Feb. 3, 2004, Yamamoto et al.
U.S. Appl. No. 10/807,332, filed Mar. 24, 2004, Yamamoto et al.
U.S. Appl. No. 10/025,653, filed Dec. 26, 2001, Yamamoto et al.
U.S. Appl. No. 10/200,535, filed Jul. 23, 2002, Yamamoto et al.
U.S. Appl. No. 10/321,462, filed Dec. 18, 2002, Morikawa et al.
Notification of Reasons for Refusal for Japanese Patent Application No. 2003-082955 dated Jul. 12, 2006 (w/ English Translation).

* cited by examiner

*Primary Examiner*—Archene Turner
(74) *Attorney, Agent, or Firm*—Oblon, Spivak, McClelland, Maier & Neustadt, P.C.

(57) ABSTRACT

A hard film formed of a material containing a $(M_{1-x}Si_x)(C_{1-d}N_d)$ compound, wherein M is at least one of Al and the elements in groups 3A, 4A, 5A and 6A, $0.45 \leq x \leq 0.98$ and $0 \leq d \leq 1$, where x, 1-x, d and 1-d are atomic ratios of Si, M, N and C, respectively.

7 Claims, 4 Drawing Sheets

CRYSTALLINE STRUCTURE
(PEAK DIFFRACTION HALF
WIDTH: 0.37°)

FIG. 4B

AMORPHOUS STRUCTURE
(PEAK DIFFRACTION HALF
WIDTH: GREATER THAN 1.5°)

HARD FILM

BACKGROUND OF THE INVENTION

1. Field of the Invention

The present invention relates to techniques relating to hard films and, more specifically, to a hard film capable of exhibiting excellent lubricity and wear resistance in an aqueous environment. More particularly, the present invention relates to techniques.relating to a hard film for improving the lubricity and wear resistance of sliding members lubricated with a water-base lubricant instead of with a lubricating oil.

2. Description of the Related Art

Most current hydraulic components for driving industrial machines are activated by oil as a working fluid. In some cases it is undesirable to use oil as a working fluid from the viewpoint of preventing environmental contamination by the effluent oil, maintaining sanitation in the food industry and preventing hydraulic devices incorporated into machines using fire, such as incinerators, from catching fire. Studies have been made of the possibility of replacing oil as a working fluid with harmless, nonflammable water as an alternative working fluid.

The following problems arise when water is used as a working fluid instead of oil. Since water does not have lubricity corresponding to that of oil, sliding members of metals will cause seizing if the sliding members are used in an aqueous environment in which water serves as a lubricant. Ceramic sliding members and engineering plastic sliding members have been proposed for use in an aqueous environment. However, such sliding members are expensive as compared with metal sliding members and inferior to metal sliding members in machinability and impact resistance. Therefore, ceramic sliding members and engineering plastic sliding members have not been practically used.

Cutting tools coated with a hard film to improve the wear resistance of the cutting tool have been proposed. For example, mentioned in JP-A 2002-18606 is "a coated cutting tool (cutting tool A) formed by coating a cutting tool body with one or a plurality of coating layers, wherein at least one of the coating layers is formed of a material having a chemical composition expressed by: $(Cr_aSi_{1-a}) (N_xB_{1-x})$, where $0.7 \leq a < 1$ and $0.4 \leq x \leq 1$, and is a CrSi film containing a silicon nitride phase and/or boron nitride phase". Mentioned also in JP-A 2002-18606 is "in the coated cutting tool A, a coated cutting tool (cutting tool B) is characterized in that at least one of the coating layers is a TiAl film containing at least Ti and Al as metallic elements, and at least N as a nonmetallic element". Mentioned also in JP-A 2002-18606 is "in the cutting tool B, a coated cutting tool (cutting tool C) is characterized in that dT/dC=0.98 to 1.02, where dT and dC are grating constants calculated by using data obtained through the x-ray diffraction of the (111)-planes of the TiAl film and the CrSi film.

Sliding members coated with the foregoing hard film (coating layer) may be used when the oil as the working fluid for the hydraulic motor for the industrial machine is replaced with water. However, the lubricity and wear resistance of the film (coating layer) having the composition mentioned in the reference in an aqueous environment are insufficient and are unable to prevent the seizing of the sliding members.

SUMMARY OF THE INVENTION

The present invention has been made in view of the foregoing problems and it is therefore an object of the present invention to provide a hard film capable of exhibiting excellent lubricity and wear resistance in an aqueous environment.

The inventor of the present invention made studies to achieve the object of the invention and have made the present invention on the basis of findings acquired by the studies. The present invention provides a hard film having excellent lubricity in an aqueous environment (hereinafter, referred to also as "water lubricity") and wear resistance.

According to a first aspect of the present invention, a hard film is formed of a material containing a $(M_{1-x}Si_x) (C_{1-d}N_d)$ compound, wherein M is at least one of elements in groups 3A, 4A, 5A and 6A and Al, $0.45 \leq x \leq 0.98$ and $0 \leq d \leq 1$, where x, 1-x, d and 1-d are atomic ratios of Si, M, N and C, respectively.

The material forming the hard film according to the first aspect of the present invention may further contain O in an atomic ration in the range of 0.01 to 0.2.

Preferably, in the hard film according to the first aspect of the present invention, the diffraction peak half width of the (111)-plane of the $(M_{1-x}Si_x) (C_{1-d}N_d)$ compound measured by x-ray diffraction is 1.5° or above.

In the hard film according to the first aspect of the present invention, it is preferable that the element M is Cr, Ti or Zr.

According to a second aspect of the present invention, a laminated hard film is formed by alternately superposing the hard film according to the first aspect of the present invention, and a hard film formed of a material containing a $(M_{1-x}Si_x) (C_{1-d}N_d)$ compound at a stacking period in the range of 1 to 1000 nm, wherein M is at least one of elements of groups 3A, 4A, 5A and 6A and Al, $0 \leq x \leq 0.45$ and $0 \leq d \leq 1$, where x, 1-x, d and 1-d are atomic ratios of Si, M, N and C, respectively.

According to a third aspect of the present invention, a hard film is formed of a material containing a $M_{1-x}S_x) (C_{1-d}N_d)$ compound on a substrate, wherein M is at least one of elements of groups 3A, 4A, 5A and 6A and Al, the most inner portion of the hard film contiguous with the substrate meets $0 \leq x \leq 0.45$ and $0 \leq d \leq 1$, where x, 1-x, d and 1-d are atomic ratios of Si, M, N and C, respectively, the most outer portion of the hard film meets $0.45 \leq x \leq 0.98$ and $0 \leq d \leq 1$, where x, 1-x, d and 1-d are atomic ratios of Si, M, N and C, respectively, and outer portion of the hard film has higher Si atomic ratio x. In the construction, the value of x may change continuously or step-wisely. The value of x may change step-wisely by laminating hard films of different compositions.

The hard films of the present invention exhibit excellent lubricity in an aqueous environment (water lubricity) and excellent wear resistance. Thus, the hard films of the present invention is suitable for forming coating layers for coating sliding members when the oil as the working fluid for the hydraulic motor for the industrial machine is replaced with water and improves the lubricity and wear resistance of sliding members in an aqueous environment.

DESCRIPTION OF THE PREFERRED EMBODIMENTS

The atomic ratios of M (metallic element) and Si of hard films (also referred to simply as "film") formed of a material containing a $(M_{1-x}Si_x)(C_{1-d}N_d)$ compound were studied to obtain a hard film having excellent lubricity and wear resistance in an aqueous environment, and the following composition was determined.

Figure 3:
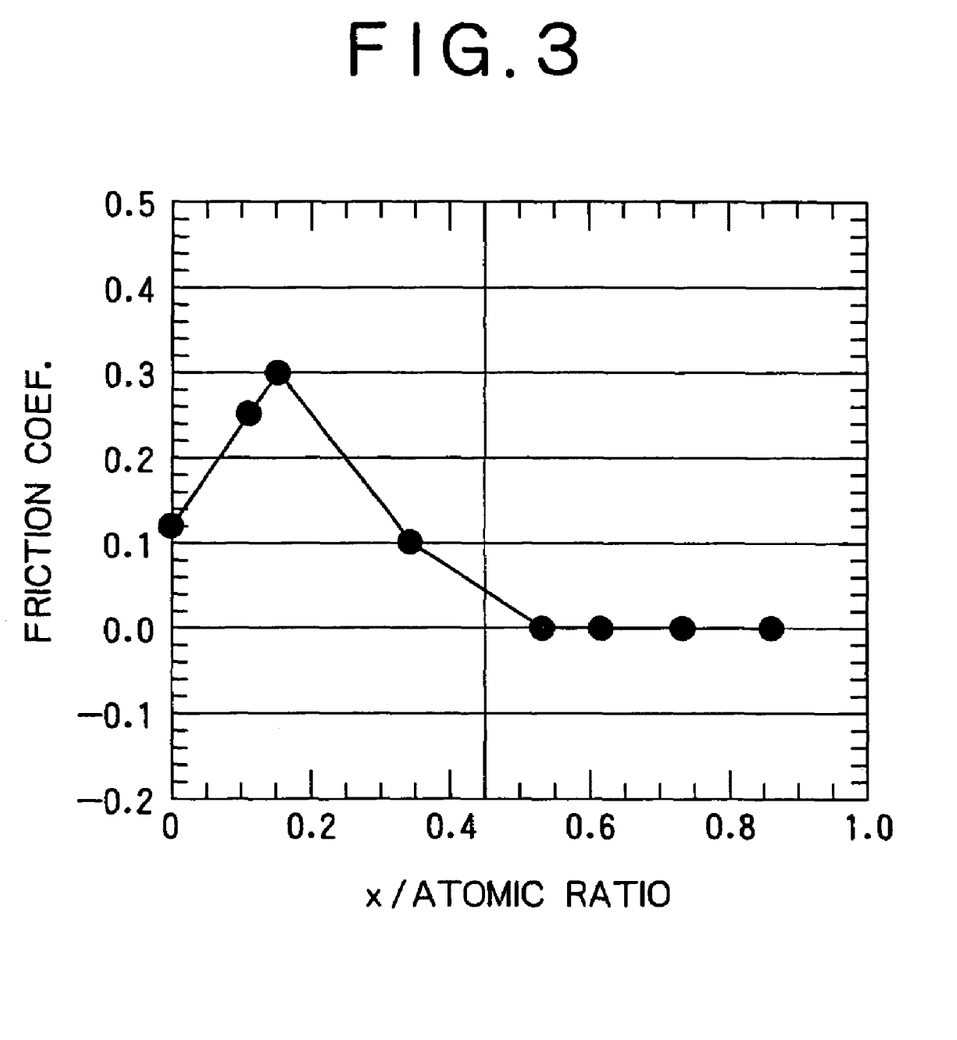
FIG. 3 is a graph showing the dependence of friction coefficient on Si atomic ratio x of the film formed of a material containing $(M_{1-x}Si_x) (C_{1-d}N_d)$ determined through the friction test of hard films formed of materials containing $(M_{1-x}Si_x)(C_{1-d}N_d)$ in an aqueous environment.

FIG. 3 shows the relation between friction coefficient and Si atomic ratio x of hard films formed of materials containing a $(M_{1-x}Si_x)(C_{1-d}N_d)$ compound determined through the friction test of the hard films in an aqueous environment. As obvious from FIG. 3, friction coefficients are as small as 0.05 when the Si atomic ratio x is 0.45 or above. Thus, hard films of the compounds having Si atomic ratios x of 0.45 or above are excellent in water lubricity and wear resistance. The Si atomic ratio x of the $(M_{1-x}Si_x)(C_{1-d}N_d)$ compound contained in the materials forming the hard films of the present invention must be 0.45 or above. In this specification, "friction coefficient of a film" signifies "friction coefficient between two identical films".

Data shown in FIG. 3 is for the hard films formed of materials containing a $(M_1-Si_x)(C_{1-d}N_d)$ compound in which M is Cr. Hard films formed of the materials containing the $(M_{1-x}Si_x)(C_{1-d}N_d)$ compound have similar characteristics regardless of the type of M. It is thought that Si is the most dominant element that reduces friction coefficient, as explained later.

Films formed of materials containing a $(M_{1-x}Si_x)(C_{1-d}N_d)$ compound having a large Si atomic ratio are insulating and difficult to form, and have low adhesion. Thus, the upper limit of the Si atomic ratio is 0.98.

The films exhibit excellent lubricity and wear resistance in an aqueous environment regardless of the atomic ratios of C and N. Suitable N atomic ratio d is in the range of 0 to 1 and a suitable C atomic ratio 1-3 is in the range of 1 to 0.

To obtain hard films formed of the materials containing the $(M_{1-x}Si_x)(C_{1-d}N_d)$ compound and having a sufficiently high hardness, M (metallic element) is at least one of metallic elements in groups 3A, 4A, 5A and 6A and Al. The element M may be an element capable of forming a nitride having a moderate hardness.

Thus, the hard film of the present invention is formed of a material containing a $(M_{1-x}Si_x)(C_{1-d}N_d)$ compound, wherein M is at least one of elements in groups 3A, 4A, 5A and 6A and Al, $0.45 \leq x \leq 0.98$ and $0 \leq d \leq 1$, where x, 1-x, d and 1-d are atomic ratios of Si, M, N and C, respectively.

The hard film exhibits excellent lubricity and wear resistance in an aqueous environment.

In the hard film of the present invention, the element M is at least one of elements in groups 3A, 4A, 5A and 6A and Al. Films of (MSi)CN compounds containing Cr have a comparatively low hardness, are less liable to damage counter sliding members and are resistant to cracking. Thus, a $(M_{1-x}Si_x)(C_{1-d}N_d)$ compound in which the element M is Cr is recommended.

Although the cause of decrease of friction coefficient in an aqueous environment with the increase of the Si atomic ratio x is not clearly known, it is inferred that Si and OH groups interact in an aqueous environment and produce a compound having a lubricating property.

Desirably, the Si atomic ratio x is in the range of 0.6 to 0.9, more desirably in the range of 0.7 to 0.9 to form hard films having a low frictional property, easy formability and good adhesion.

Any limits are not set particularly for the respective atomic ratios of C and N. Some metallic elements as the element M are unable to form a stable carbide. When such a metallic element is used as the element M, a recommended N atomic ratio d is in the range of 0.5 to 1. Metallic elements that do not form a stable carbide are Cr and Al.

The hard film of the present invention is formed of the material containing a $(M_{1-x}Si_x)(C_{1-d}N_d)$ compound, and is not formed of only a $(M_{1-x}Si_x)(C_{1-d}N_d)$ compound. In some cases, the hard film is formed of only a $(M_{1-x}Si_x)(C_{1-d}N_d)$ compound. The components of the hard film are not limited to the foregoing elements and may include, as additional components, elements other than the foregoing elements.

If the material contains oxygen as an additional component in an O atomic ratio in the range of 0.01 to 0.2, a film that exhibits a lower frictional property in an aqueous environment can be obtained. Thus, the addition of oxygen to the material enhances the water lubricity and wear resistance of the hard film. Oxygen contained in the material as an additional component oxidizes part of Si to promote bonding between Si and OH groups contained in the aqueous environment and thereby the frictional property of the hard film can be lessened. The addition of O is ineffective when O atomic ratio is less than 0.01. When the O atomic ratio exceeds 0.2, the adhesion of the hard film decreases, the hard film becomes insulating and difficult to form. Therefore, a suitable O atomic ratio is in the range of 0.01 to 0.2, more preferably 0.01 to 0.1.

Figure 4A:
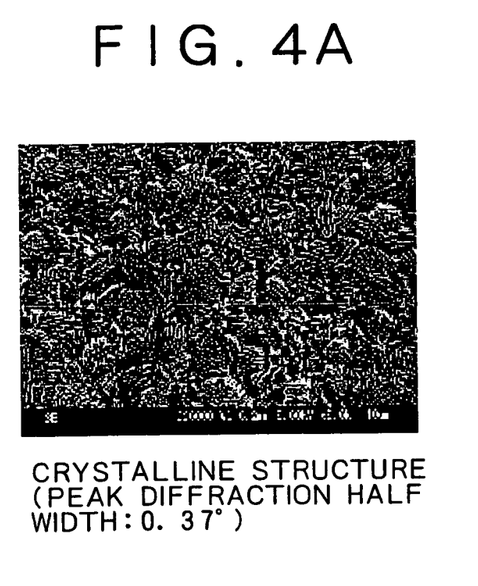
FIG. 4 is a photograph showing the respective surfaces of a crystalline film (diffraction peak half width=0.37°) and an amorphous film (diffraction peak half width>1.5°.
Figure 4B:
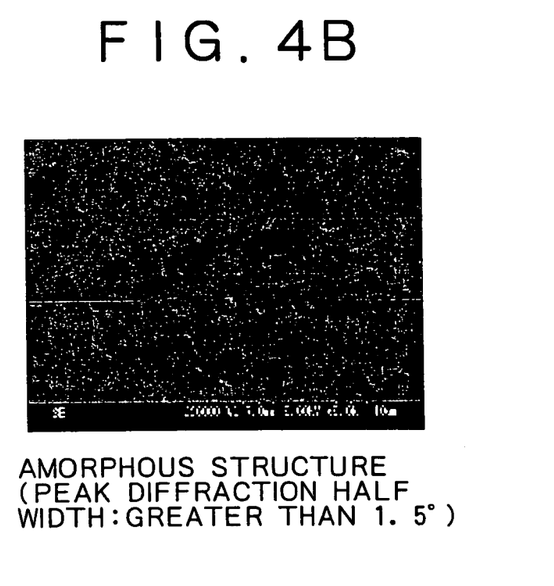

The hard film of the present invention contains an M(CN) compound of crystalline structure (rock-salt structure inmost cases) when the Si atomic ratio x is small. The size of crystal grains in the film decreases with the increase of the Si atomic ratio x. It was found through observation that the film having a large Si atomic ratio x had amorphous structure. As obvious from FIG. 4, whereas a film of crystalline structure has a surface having fine irregularities, a film of amorphous structure has a very smooth surface. It is considered that the smooth surface provides the film with a low frictional property in an aqueous environment. The degree of amorphousness is defined by the diffraction peak half width of the (111)-plane of the $(M_{1-x}Si_x)(C_{1-d}N_d)$ compound contained in the film measured by x-ray diffraction. A greater diffraction peak half width corresponds to a larger degree of amorphousness. The surface of a film is very smooth when the diffraction peak half width is 1.5° or above. Thus, the surface of a film is very smooth when the diffraction peak half width of the (111)-plane of the $(M_{1-x}Si_x)(C_{1-d}N_d)$ compound contained in the film is 1.5° or above, and the film has a low frictional property in an aqueous environment.

The diffraction peak half width of the (111)-plane is dependent mostly on the Si atomic ratio x. The diffraction peak half width of the (111)-plane is 1.5° or above when the Si atomic ratio x is 0.45 or above.

As mentioned above, a film of a $(M_{1-x}Si_x)(C_{1-d}N_d)$ compound exhibits a small friction coefficient of 0.05 and has excellent lubricity and wear resistance in an aqueous environment when the Si atomic ration x is 0.45 or above. However, even in an Si atomic ration range below 0.45, the film exhibits small friction coefficients of 0.3 or below in an aqueous environment, which is small enough to apply the film to some purposes. The adhesion of a film having an Si atomic ratio x of 0.45 or above is slightly lower than that of a film having an Si atomic ratio x below 0.45. It was found that a laminated film consisting of a film having an Si atomic ratio x of 0.45 or above and a film having an Si atomic ratio x below 0.45 was capable of coping with desired properties in an aqueous environment, i.e., water lubricity and wear resistance, and desired adhesion. Although dependent on uses, the range of effective stacking period is in the range of 1 to 1000 nm. Preferably, effective stacking period is in the range of 10 to 100 nm.

It is effective in improving adhesion to form a film having an Si atomic ration x below 0.45 on a substrate and to form a laminated film consisting of films having Si atomic ratios increasing toward the outermost film.

A film according to a second aspect of the present invention is formed in structure based on the foregoing findings. A laminated hard film in a second aspect of the present invention is formed by alternately superposing the hard film according to the first aspect of the present invention, and a hard film formed of a material containing a $(M_{1-x}Si_x)$ $(C_{1-d}N_d)$ compound at a stacking period in the range of 1 to 1000 nm, wherein M is at least one of elements of groups 3A, 4A, 5A and 6A and Al, $0 \leq x \leq 0.45$ and $0 \leq d \leq 1$, where x, 1-x, d and 1-d are atomic ratios of Si, M, N and C, respectively.

A hard film according to a third aspect of the present invention is formed of a material containing a $(M_{1-x}Si_x)$ $(C_{1-d}N_d)$ compound on a substrate, wherein M is at least one of elements of groups 3A, 4A, 5A and 6A and Al, the most inner portion of the hard film contiguous with the substrate meets $0 \leq x \leq 0.45$ and $0 \leq d \leq 1$, where x, 1-x, d and 1-d are atomic ratios of Si, M, N and C, respectively, the most outer portion of the hard film meets $0.45 \leq x \leq 0.98$ and $0 \leq d \leq 1$, where x, 1-x, d and 1-d are atomic ratios of Si, M, N and C, respectively, and outer portion of the hard film has higher Si atomic ratio x. In the construction, the value of x may change continuously or step-wisely. The value of x may change step-wisely by laminating hard films of different compositions.

The hard film according to the second aspect of the present invention has excellent lubricity and wear resistance in an aqueous environment and has high adhesion. The hard film according to the third aspect of the present invention has excellent lubricity and wear resistance in an aqueous environment and has further improved adhesion.

When the adhesion of the hard film to the substrate is important, it is effective to form a metallic intermediate layer of the element M on the substrate.

Although dependent on uses, the hard film according to the present invention has a thickness in the range of 0.5 to 10 μm.

A hard film in a modification of the hard film according to the first aspect of the present invention contains oxygen in an O atomic content in the range of 0.01 to 0.2; that is, this hard film is formed of the material containing the $(M_{1-x}Si_x)$ $(C_{1-d}N_d)$ compound containing oxygen in an O atomic ratio in the range of 0.01 to 0.2.

Thus, this hard film contains a $(M_{1-x}Si_x)$ $(C_aN_bO_c)$ compound, wherein M is at least one of elements in groups 3A, 4A, 5A and 6A and Al, $0.45 \leq x \leq 0.98$, $0 \leq a \leq 1$, $0 \leq b \leq 1$, $0 < c < 1$, $a+b+c=1$, and x, 1-x, a, b and c are atomic ratios of Si, M, C, N and O, respectively.

In the laminated hard films according to the second and the third aspect of the present invention (in the case of laminating in the third aspect), all the layers of the hard films do not necessarily contain the same element as the element M and may contain different elements as the element M, respectively. Such laminated hard films consisting of hard films containing different elements as the element M is the same in lubricity and wear resistance in an aqueous environment as that consisting of hard films containing the same element as the element M.

EXAMPLES

Example 1 and Comparative Example 1

Figure 1:
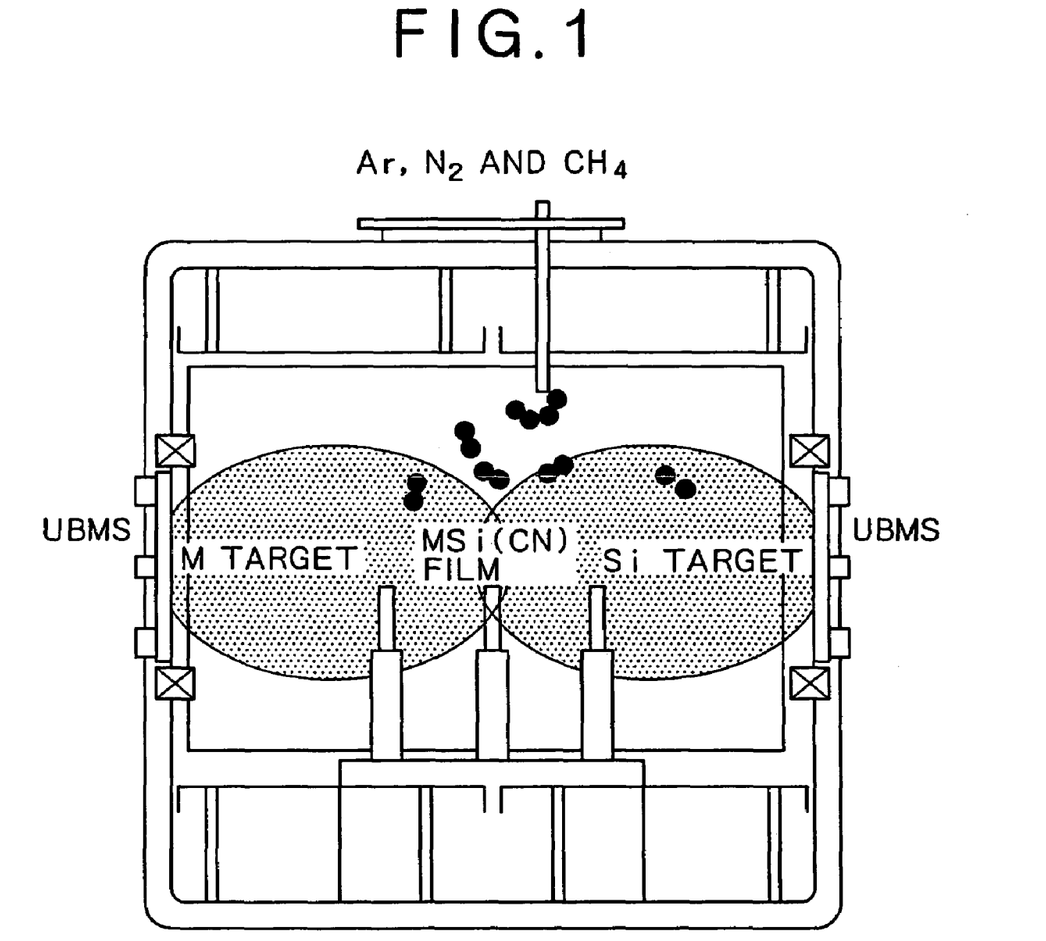
FIG. 1 is a typical view of a sputtering system for forming a hard film in a preferred embodiment according to the present invention.

A sputtering system provided with two unbalanced magnetron sputtering sources (UBMs) as shown in FIG. 1 was used to form hard films in Example 1 and Comparative example 1. An M target, namely, metal target of an element M, and an Si target were placed in the UBMs, respectively, and a film was deposited on a substrate. MSi (C,N) films, namely, $(M_{1-x}Si_x)$ $(C_{1-d}N_d)$ films, in Example 1 and Comparative example 1 were deposited on substrates.

The M and the Si target were made to discharge simultaneously, and the ratio between the magnitudes of power supplied to the M and the Si target was adjusted to adjust the composition represented by Si atomic ratio x and such of a material forming the film. A mixed gas containing argon gas, nitrogen gas and/or methane gas was used as a process gas. The pressure of the process gas was maintained at 0.6 Pa, and the ratio between argon gas and a reaction gas (nitrogen gas and/or methane gas) was regulated in the range of 0.2 to 0.5. A bias voltage applied to the substrate was in the range of 50 to 100 V, and the temperature of the substrate was in the range of 300° C. to 400° C. Carbide chips, stainless steel vanes (Grade: SUS304, JIS) and stainless steel disks (Grade: SUS304, JIS) were used as substrates.

Figure 2:
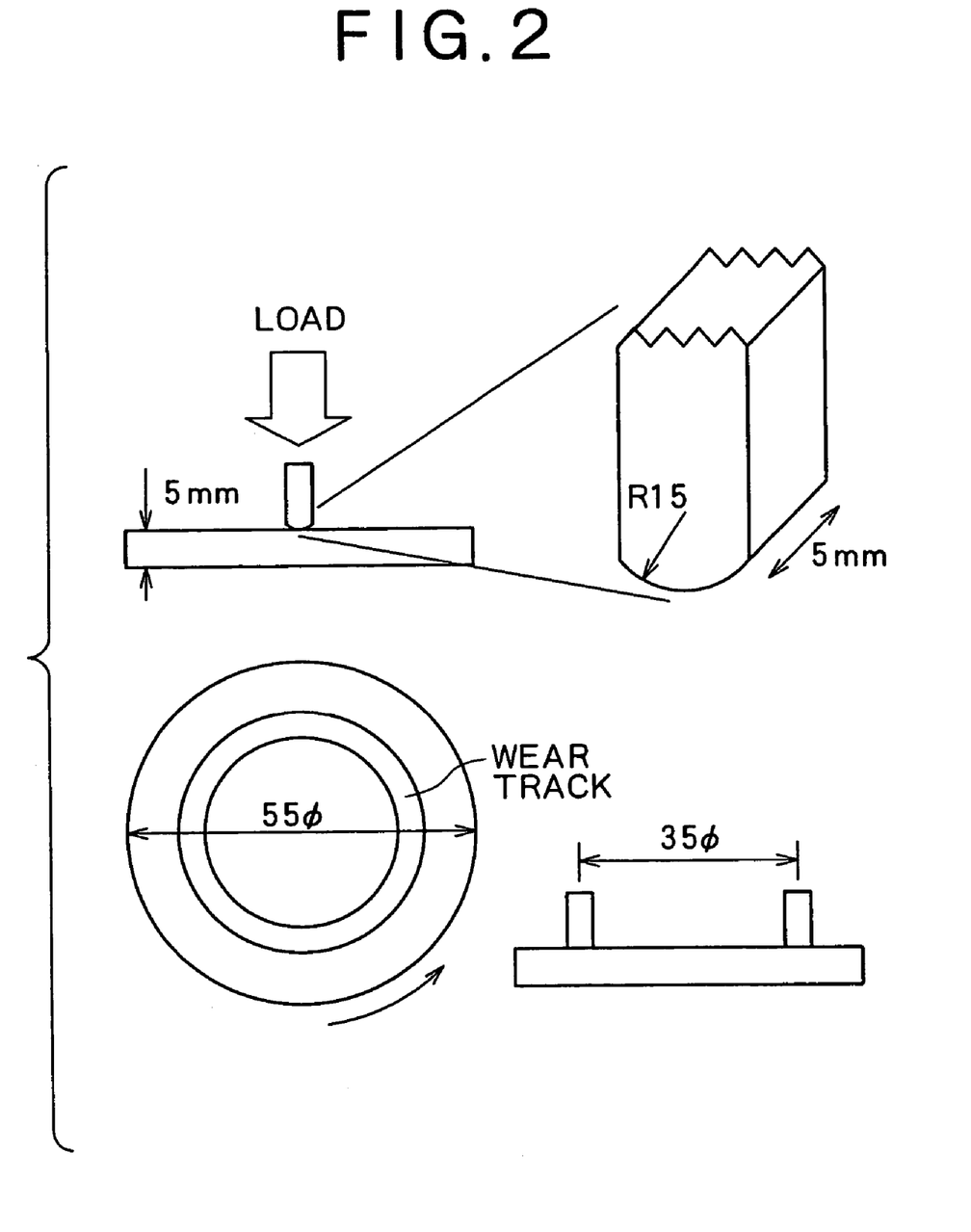
FIG. 2 is a typical view of assistance in explaining a friction test for testing the wear resistance of the hard film embodying the present invention.

Specimen films formed on the substrates were tested. The structure of the films was analyzed (composition analysis and x-ray diffraction analysis), the hardness of the films was measured, the adhesion of the films to the substrates was measured, and the morphology of the surfaces of the films was observed. The specimen films were subjected to a friction test in distilled water. The friction test used a vane-on-disk type friction tester as shown in FIG. 2. Friction coefficients were determined and specific wear amounts were measured. The friction test used a load of 20 N and a friction distance of 1 km. Test results are shown in Table 1.

Carbide chips, stainless steel vanes (Grade: SUS304, JIS) and stainless steel disks (Grade: SUS304, JIS) were used selectively as substrates according to the contents of the tests. Mirror-finished carbide chips were used as substrates for hard films to be subjected to the structural analysis, the measurement of hardness and adhesion and the observation of surface morphology. Stainless steel vanes and disks were used as substrates for hard films to be subjected to the friction test.

The hardness of the film was measured by a micro Vickers hardness tester using a load of 25 kgf and a holding time of 15 s. The adhesion of the film to the substrate was measured by a scratch tester using a diamond indenter having a round tip of a radius of 200 μm. The scratch tester applied a vertical load in the range of 0 to 100 N at a loading rate of 100 N/min and scratched the film with the diamond indenter at a scratching speed of 10 mm/min until the film peeled off. The friction test used the vanes respectively coated with the hard films of MSiN, and disks coated respectively with the hard films of MSiN in combination as shown in FIG. 2. The vanes and the disks had shapes shown in FIG. 2. Friction coefficient was measured during the friction test, an abrasion volume was calculated after the friction test, and the wear resistance was represented by a specific abrasion loss obtained by dividing the abrasion volume by the vertical load and the friction distance. Distilled water was used for the friction test.

Example 2

A sputtering system provided with two UBMs as shown in FIG. 1 was used to form hard films in Example 2. An M target, namely, metal target of an element M, and an Si target were placed in the UBMs, respectively, and a film was deposited on a substrate. MSi(NO) films, namely, $(M_{1-x}Si_x)$ $(N_bO_{1-b})$, i.e., $(M_{1-x}Si_x)$ $(N_bO_c)$, where b+c=1 were deposited on substrates.

The M and the Si target were made to discharge simultaneously, and the ratio between the magnitudes of power supplied to the M and the Si target was adjusted to adjust the composition represented by Si atomic ratio x and such of a material forming the film. A mixed gas containing argon gas, nitrogen gas and oxygen gas was used as a process gas. The pressure of the process gas was maintained at 0.6 Pa, and the ratio between argon gas and reaction gases (nitrogen gas and oxygen gas) was regulated in the range of 0.2 to 0.5. A bias voltage applied to the substrate was in the range of 50 to 100 V, and the temperature of the substrate was in the range of 300° C. to 400° C. Carbide chips, stainless steel vanes (Grade: SUS304, JIS) and stainless steel disks (Grade: SUS304, JIS) were used as substrates.

Specimen films formed on the substrates were tested similarly to the specimen films of Example 1 and Comparative example. Results of the tests are shown in Table 2.

Example 3

A sputtering system provided with two UBMs as shown in FIG. 1 was used to form hard films in Example 2. An M target, namely, metal target of an element M, and an Si target were placed in the UBMs, respectively, and a film was deposited on a substrate. Laminated or compositionally graded MSi(N) films, namely, $(M_{1-x}Si_x)$ (N), were deposited on substrates. The laminated films are embodiments of the second aspect of the present invention. The compositionally graded film is an embodiment of the third aspect of the present invention.

The M and the Si target were made to discharge simultaneously, and the ratio between the magnitudes of power supplied to the M and the Si target was adjusted to adjust the composition represented by Si atomic ratio x and such of a material forming the film. A mixed gas containing argon gas and nitrogen gas was used as a process gas. The pressure of the process gas was maintained at 0.6 Pa, and the ratio between argon gas and the reaction gas, i.e., nitrogen gas, was regulated in the range of 0.2 to 0.5. A bias voltage applied to the substrate was in the range of 50 to 100 V, and the temperature of the substrate was in the range of 300° C. to 400° C. Carbide chips, stainless steel vanes (Grade: SUS304, JIS) and stainless steel disks (Grade: SUS304, JIS) were used as substrates.

Specimen films formed on the substrates were tested similarly to those in Example 1 and Comparative example. Results of the tests are shown in Table 3.

Table 1 shows test results for the hard films in Example 1 and Comparative example 1. In Tables 1, 2 and 3, the hardnesses of the films are in Vickers hardness HV. Films having larger Vickers hardnesses are harder films. Films having higher adhesions N are more excellent in adhesion to the substrate. Films having smaller friction coefficients μ are more excellent in lubricity in an aqueous environment. Specific abrasion loss (mm³/N·m) obtained by dividing the abrasion volume by the vertical load and the friction distance expresses an abrasion volume per unit load and unit friction distance. Films having smaller specific abrasion losses are more excellent in wear resistance. In Tables 1 to 3, "1.00E-07" signifies $1.00 \times 10^{-7}$, "6.00-08" signifies $6.00 \times 10^{-8}$.

(1) Example 1 and Comparative Example 1

As obvious from Table 1, the element M of specimen films Nos. 1 to 10 is Cr, and the Si atomic ratios x of specimen films Nos. 1 to 5 is below the lower limit Si atomic ratio of 0.45. Specimen films Nos. 1 to 5 are Comparative examples. Although specimen films Nos. 1 to 5 are excellent in adhesion to the substrate, the same have low Vickers hardnesses and large friction coefficients in the range of 0.24 to 0.09, are unsatisfactory in water lubricity, and have large specific abrasion losses in the range of 1.00E-07 to 2.60E-07, which indicates unsatisfactory wear resistance in an aqueous environment.

Specimen films Nos. 7 to 9 are those according to the first aspect of the present invention. Specimen film No. 6 is a film according to a second aspect of the present invention and has a diffraction peak half width of 2.3. Specimen films Nos. 6 to 9 are excellent in adhesion to the substrates, have small specific abrasion losses in the range of 1.20E-08 to 6.00E-08 and are excellent in wear resistance in an aqueous environment. Specimen films Nos. 8 and 9 have particularly small specific abrasion losses, which proves excellent wear resistance in an aqueous environment.

Specimen film No. 10 is a Comparative example having an Si atomic ratio greater than the upper limit Si atomic ratio x of 0.98. Although specimen film No. 10 has a high hardness, a small friction coefficient smaller than 0.01 and a small specific abrasion loss of 1.00E-08, and is excellent in water lubricity, the adhesion of specimen film No. 10 to the substrate is as low as 40 N.

The element M of the specimen films Nos. 11 to 20 is Ti. The specimen films Nos. 11 to 15 have Si atomic ratios smaller than the lower limit Si atomic ratio and are Comparative examples. Although excellent in adhesion to the substrate, the specimen films Nos. 11 to 15 have large friction coefficients in the range of 0.13 to 0.27, low water lubricity, large specific abrasion loss, and low wear resistance in an aqueous environment.

Specimen films Nos. 17 to 19 correspond to films according to the first aspect of the present invention. A specimen film No. 16 has a diffraction peak half width of 2.6. The specimen films Nos. 16 to 19 are excellent in adhesion to the substrates, have high hardness, small friction coefficients less than 0.01, excellent water lubricity and small specific abrasion loss, and are excellent in wear resistance in an aqueous environment. Above all, the specimen films Nos. 18 and 19 have very small specific abrasion losses and very excellent in wear resistance in an aqueous environment.

The specimen film No. 20 has an Si atomic ratio greater than the upper limit Si atomic ratio of 0.98 for the films according to the first aspect of the present invention. The specimen film No. 20 corresponds to a film in comparative example. Although the specimen film No. 20 has a high hardness, a small friction coefficient less than 0.01, excellent water lubricity and a small specific abrasion loss, and is excellent in wear resistance in an aqueous environment, the adhesion of specimen film No. 20 to the substrate is as low as 40 N.

Specimen films Nos. 21 to 23 contain C. Materials forming the specimen films Nos. 21 to 23 have small N atomic ratios d or do not contain N. The specimen films Nos. 21 to 23 corresponds to films according to the first aspect of the present invention. The adhesion of the films to the substrates and the hardness of the films decrease with the increase of the C atomic ratio, i.e., with the decrease of the N atomic ratio d.

Remark "(111) Undetectable" in Table 1 signifies that the diffraction peak half width of the (111)-plane was very wide and diffracted peaks could not be detected. It is considered that the diffraction peak half width of the (111)-plane is infinity in a state specified by such a remark, and the film meet the condition that the diffraction peak half width of the (111)-plane must be 1.5° or above.

(2) Example 2

As obvious from Table 2, the element M of specimen films Nos. 1 to 5 is Cr. The specimen film No. 1 corresponds to the specimen film No. 8 in Table 1, and the specimen films Nos. 2 to 4 correspond to films in modifications of those according to the first aspect of the present invention.

As obvious from Table 2, the specimen films Nos. 2 to 4, as compared with the specimen film No. 1 have small specific abrasion losses and are excellent in wear resistance in an aqueous environment. A specimen film No. 5 has an O atomic ratio higher than the upper limit O atomic ratio of 0.2 specified by the present invention and hence has low adhesion to the substrate.

The element M of specimen films Nos. 6 to 10 shown in Table 2 is Zr. The specimen films Nos. 7 to 9, as compared to the specimen film No. 6, has small specific abrasion losses and are excellent in wear resistance in an aqueous environment. The specimen film No. 10 has an O atomic ratio higher than the upper limit O atomic ratio of 0.2 specified by the present invention and hence has low adhesion to the substrate.

Although the specimen films Nos. 5 and 10 shown in Table 2, as compared with the specimen films in comparative examples shown in Table 1, have low hardnesses, the same have small specific abrasion losses and are excellent in wear resistance in an aqueous environment. The specimen film No 20 in a comparative example shown in Table 1 has somewhat low adhesion. Although the specimen films Nos. 5 and 10 shown in Table 2 are inferior to the specimen films in modifications of the films according to the first aspect of the present invention in ability to cope with both adhesion and wear resistance in an aqueous environment, the same are superior to the films in comparative examples.

It is known from the comparative examination of the films formed of materials containing $(Cr_{1-2}Si_x)(N_bO_c)$ and those of materials containing $(Zr_{1-2}Si_x)(N_bO_c)$ shown in Table 2 on an assumption that values of x, b and c for the films are the same that the film formed of the material in which the element M is Cr has a specific abrasion loss in an aqueous environment smaller than that of the film formed of the material in which the element M is Zr, and is excellent in wear resistance.

(3) Example 3

Results of tests of films in Example 3 are shown in Table 3. Specimen films Nos. 1 to 4 shown in Table 3 are those according to a second aspect of the present invention. Each of the specimen films Nos. 1 to 4 was formed by alternately superposing a first film 1 and a second film 2 at a stacking period shown in Table 3. In all the specimen films Nos. 1 to 4, the bottom layer contiguous with the substrate is the first film 1 and the top layer is the second film 2. The second film has a composition similar to that of the specimen film No. 8 shown in Table 1. The specimen films Nos. 1 to 4 have different stacking periods, respectively.

The specimen films No. 1 to 4, as compared with the specimen film No. 8 shown in Table 1, have high adhesion to the substrate. There is a tendency that adhesion increases with the increase of stacking period, while friction coefficient and specific abrasion loss are not dependent on stacking period.

A specimen film No. 6 in Table 3 is a film according to a third aspect of the present invention. In Table 3, a film denoted by "Substrate side" is the film forming the bottom layer contiguous with the substrate, and a film denoted by "Surface side" is a film forming the top layer. The Si atomic ratios of the upper films are greater than those of the lower films. Thus, the laminated films are formed in compositionally graded structures.

The specimen film No. 6, as compared with the specimen film No. 8 shown in Table 1, has high adhesion to the substrate.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

TABLE 1

| | M | 1-x M | x Si | 1-d C | d N | Hardness HV | Adhesion N | Friction coefficient μ | Specific wear $mm^3$/N-m | Diffraction peak half width |
|---|---|---|---|---|---|---|---|---|---|---|
| 1 | Cr | 1 | 0 | 0 | 1 | 1500 | 80 | 0.12 | 1.00E−07 | 0.36 |
| 2 | Cr | 0.95 | 0.05 | 0 | 1 | 1550 | 75 | 0.15 | 1.50E−07 | 0.37 |
| 3 | Cr | 0.9 | 0.1 | 0 | 1 | 1570 | 75 | 0.24 | 2.60E−07 | 0.45 |
| 4 | Cr | 0.75 | 0.25 | 0 | 1 | 1650 | 75 | 0.22 | 2.30E−07 | 1.2 |
| 5 | Cr | 0.6 | 0.4 | 0 | 1 | 1700 | 72 | 0.09 | 1.20E−07 | 1.48 |
| 6 | Cr | 0.5 | 0.5 | 0 | 1 | 2000 | 67 | <0.01 | 6.00E−08 | 2.3 |
| 7 | Cr | 0.35 | 0.65 | 0 | 1 | 2050 | 67 | <0.01 | 4.20E−08 | (111) Undetectable |
| 8 | Cr | 0.2 | 0.8 | 0 | 1 | 2000 | 65 | <0.01 | 3.40E−08 | (111) Undetectable |
| 9 | Cr | 0.1 | 0.9 | 0 | 1 | 2010 | 65 | <0.01 | 1.20E−08 | (111) Undetectable |
| 10 | Cr | 0 | 1 | 0 | 1 | 1900 | 40 | <0.01 | 1.00E−08 | (111) Undetectable |
| 11 | Ti | 1 | 0 | 0 | 1 | 2000 | 70 | 0.13 | 2.00E−07 | 0.25 |
| 12 | Ti | 0.95 | 0.05 | 0 | 1 | 2200 | 70 | 0.16 | 2.30E−07 | 0.27 |
| 13 | Ti | 0.9 | 0.1 | 0 | 1 | 2300 | 68 | 0.27 | 4.50E−07 | 0.27 |
| 14 | Ti | 0.75 | 0.25 | 0 | 1 | 2250 | 67 | 0.24 | 3.50E−07 | 0.8 |
| 15 | Ti | 0.6 | 0.4 | 0 | 1 | 2200 | 65 | 0.13 | 3.40E−07 | 1.45 |

TABLE 1-continued

|  | M | 1-x M | x Si | 1-d C | d N | Hardness HV | Adhesion N | Friction coefficient μ | Specific wear mm³/N-m | Diffraction peak half width |
|---|---|---|---|---|---|---|---|---|---|---|
| 16 | Ti | 0.5 | 0.5 | 0 | 1 | 2150 | 64 | <0.01 | 8.00E−08 | 2.6 |
| 17 | Ti | 0.35 | 0.65 | 0 | 1 | 2200 | 63 | <0.01 | 5.50E−08 | (111) Undetectable |
| 18 | Ti | 0.2 | 0.8 | 0 | 1 | 2150 | 63 | <0.01 | 3.20E−08 | (111) Undetectable |
| 19 | Ti | 0.1 | 0.9 | 0 | 1 | 2100 | 57 | <0.01 | 2.80E−08 | (111) Undetectable |
| 20 | Ti | 0 | 1 | 0 | 1 | 2010 | 40 | <0.01 | 1.00E−08 | (111) Undetectable |
| 21 | Cr | 0.2 | 0.8 | 0.4 | 0.6 | 2050 | 65 | <0.01 | 3.40E−08 | (111) Undetectable |
| 22 | Cr | 0.2 | 0.8 | 0.2 | 0.8 | 1950 | 55 | <0.01 | 3.20E−08 | (111) Undetectable |
| 23 | Cr | 0.2 | 0.8 | 1 | 0 | 1900 | 55 | <0.01 | 3.20E−08 | (111) Undetectable |

TABLE 2

|  | M | 1-x M | x Si | C | b N | 1-b O | Hardness HV | Adhesion N | Friction coefficient μ | Specific wear mm³/N-m |
|---|---|---|---|---|---|---|---|---|---|---|
| 1 | Cr | 0.2 | 0.8 | 0 | 1 | 0 | 2000 | 65 | <0.01 | 3.40E−08 |
| 2 | Cr | 0.2 | 0.8 | 0 | 0.98 | 0.02 | 2000 | 65 | <0.01 | 2.30E−08 |
| 3 | Cr | 0.2 | 0.8 | 0 | 0.92 | 0.08 | 2000 | 65 | <0.01 | 2.40E−08 |
| 4 | Cr | 0.2 | 0.8 | 0 | 0.85 | 0.15 | 1950 | 65 | <0.01 | 3.10E−08 |
| 5 | Cr | 0.2 | 0.8 | 0 | 0.75 | 0.25 | 1700 | 45 | 0.03 | 6.70E−08 |
| 6 | Zr | 0.2 | 0.8 | 0 | 1 | 0 | 2350 | 65 | <0.01 | 4.20E−08 |
| 7 | Zr | 0.2 | 0.8 | 0 | 0.98 | 0.02 | 2350 | 65 | <0.01 | 2.90E−08 |
| 8 | Zr | 0.2 | 0.8 | 0 | 0.92 | 0.08 | 2250 | 65 | <0.01 | 2.50E−08 |
| 9 | Zr | 0.2 | 0.8 | 0 | 0.88 | 0.12 | 2200 | 65 | <0.01 | 3.30E−08 |
| 10 | Zr | 0.2 | 0.8 | 0 | 0.75 | 0.25 | 1900 | 45 | 0.03 | 7.00E−08 |

TABLE 3

|  | First film | Second film | Slacking period nm | Hardness HV | Adhesion N | Friction coefficient μ | Specific wear mm³/N-m |
|---|---|---|---|---|---|---|---|
| 1 | (Cr0.95, Si0.05) N | (Cr0.2, Si0.8) N | 2 | 1950 | 70 | <0.01 | 4.50E−08 |
| 2 | (Cr0.95, Si0.05) N | (Cr0.2, Si0.8) N | 20 | 1950 | 68 | <0.01 | 3.40E−08 |
| 3 | (Cr0.95, Si0.05) N | (Cr0.2, Si0.8) N | 300 | 1950 | 72 | <0.01 | 3.60E−08 |
| 4 | (Cr0.95, Si0.05) N | (Cr0.2. Si0.8) N | 800 | 1950 | 74 | <0.01 | 4.10E−08 |
| 5 | Substrate side | Surface side |  |  |  |  |  |
| 6 | (Cr0.95. Si0.05) N | (Cr0.2. Si0.8) N | Compositionally graded structure | 1950 | 76 | <0.01 | 3.50E−08 |

What is claimed is:

1. A hard film formed of a material containing a $(M_{1-x}Si_x)(C_{1-d}N_d)$ compound, wherein M is Cr, $0.55 \leq x \leq 0.98$ and $0 \leq d \leq 1$, where x, 1-x, d and 1-d are atomic ratios of Si, M, N and C, respectively, and the hard film has a combination of lubricity, low friction coefficient of less than 0.01 μ, wear resistance provided by a hardness of 1900-2200 HV, small specific abrasion loss of $1.20 \times 10^{-8}$–$5.50 \times 10^{-8}$ mm³/N-m, and adhesion of 55-67 N to a substrate in an aqueous environment.

2. The hard film according to claim 1, wherein the material further contains O in an atomic ratio in the range of 0.01 to 0.2.

3. The hard film according to claim 1, wherein diffraction peak half width of a (111)-plane of the $(M_{1-x}Si_x)(C_{1-d}N_d)$ compound measured by x-ray diffraction is 1.50° or above.

4. The hard film according to claim 1, wherein $0.6 \leq x \leq 0.98$.

5. The hard film according to claim 1, wherein $0.6 \leq x \leq 0.9$.

6. The hard film according to claim 1, wherein $0.7 \leq x \leq 0.9$.

7. A laminated hard film formed by alternately superposing the hard film according to claim 1, and a hard film formed of a material containing a $(M_{1-x}Si_x)(C_{1-d}N_d)$ compound at a stacking period in the range of 1 to 1000 nm, wherein M is at least one of elements of groups 3A, 4A, 5A and 6A and Al, $0 \leq x \leq 0.45$ and $0 \leq d \leq 1$, where x, 1-x, d and 1-d are atomic ratios of Si, M, N and C, respectively.

* * * * *

UNITED STATES PATENT AND TRADEMARK OFFICE
CERTIFICATE OF CORRECTION

PATENT NO.         : 7,294,416 B2
APPLICATION NO. : 10/807332
DATED              : November 13, 2007
INVENTOR(S)        : Kenji Yamamoto et al.

It is certified that error appears in the above-identified patent and that said Letters Patent is hereby corrected as shown below:

On the title page, Item (73), the Assignee. Item (73) should read:

-- Assignee: Kabushiki Kaisha Kobe Seiko Sho (Kobe Steel, Ltd.); Kobe-shi, (JP) --

Signed and Sealed this

Twenty-ninth Day of April, 2008

JON W. DUDAS
*Director of the United States Patent and Trademark Office*